United States Patent [19]
Edwards et al.

[11] Patent Number: 4,774,481
[45] Date of Patent: Sep. 27, 1988

[54] WIDEBAND TRANSMISSION LINE SIGNAL COMBINER/DIVIDER

[75] Inventors: Richard C. Edwards; Burton L. Martin, both of Cedar Rapids, Iowa

[73] Assignee: Rockwell International Corporation, El Segundo, Calif.

[21] Appl. No.: 913,201

[22] Filed: Sep. 30, 1986

[51] Int. Cl.$^4$ ............................................. H01P 5/12
[52] U.S. Cl. .................... 333/127; 333/136
[58] Field of Search ............... 333/100, 124, 127, 125, 333/136; 330/286, 295, 124 R, 53, 54

[56] References Cited

U.S. PATENT DOCUMENTS

| | | | |
|---|---|---|---|
| 3,103,638 | 9/1963 | Greuet | 333/127 |
| 3,400,339 | 9/1968 | Shone | 333/9 |
| 3,422,377 | 1/1969 | Vient | 333/127 |
| 3,480,885 | 11/1969 | Schrank | 333/7 |
| 3,490,054 | 1/1970 | Seidel | 333/10 |
| 3,764,940 | 10/1973 | Vergnolle | 333/8 |
| 4,251,784 | 2/1981 | Luetzelschwab et al. | 333/127 |
| 4,356,462 | 10/1982 | Bowman | 333/128 |
| 4,367,445 | 1/1983 | Dydyk | 333/127 |
| 4,463,326 | 7/1984 | Hom | 333/128 |
| 4,543,545 | 9/1985 | Craine et al. | 333/128 |
| 4,547,745 | 10/1985 | Freitag et al. | 330/286 |
| 4,583,061 | 4/1986 | O'Shea | 333/116 |
| 4,605,902 | 8/1986 | Harrington | 333/109 X |
| 4,647,868 | 3/1987 | Mueller | 333/124 X |

OTHER PUBLICATIONS

Sukhova et al., "Power Dividers... Lines", Radio Eng. & Electron. Phys. (USA), vol. 22, No. 1, Jan. 1977, pp. 31-36.

Primary Examiner—Eugene R. LaRoche
Assistant Examiner—Seung Ham
Attorney, Agent, or Firm—M. Lee Murrah; V. Lawrence Sewell; H. Fredrick Hamann

[57] ABSTRACT

RF signals may be split or combined across a wide band of frequencies with low insertion losses, large isolation between input ports, and low voltage standing wave ratio by means of coaxial transmission line sections interconnected in a bridge configuration. Even mode impedances between the cable shield and the common ground plane may be eliminated by placing ferrite sleeves on each line section. Impedance transformations introduced by the splitter/combiner are counteracted by a coaxial line impedance transformer.

4 Claims, 3 Drawing Sheets

WIDEBAND TRANSMISSION LINE SIGNAL COMBINER/DIVIDER

BACKGROUND OF THE INVENTION

The invention relates to RF signal combiners and dividers, and more particularly to RF signal combiners and dividers for use with solid state power amplifiers.

The development of solid-state power amplifiers for RF transmitters has created challenges to designers not present in previous tube designs. One major problem with solid-state designs is their limited power handling capability. While high power devices have been developed, they are generally quite expensive and thus are not desirable for designs where cost is a significant factor.

One strategy for solving this dilemma has been to divide the signal to be amplified into several components and direct them to a like number of smaller solid-state power amplifiers. The outputs of the power amplifiers are then combined to provide an output signal level which is comparable to or higher than the output signal which could have been obtained from a single high power solid-state power amplifier.

This divide-and-conquer strategy has its own drawbacks, however. The primary drawback is that signal dividers and combiners have usually been implemented using conventional wound transformers and lumped inductive and capacitive components to achieve the required impedance matching. Such components are inherently narrow-banded and are thus impractical for applications where wide bandwidths are required. Modern solid-state power amplifiers are generally broad-banded, and conventional narrow-banded signal splitters and combiners would severely limit their utility.

It is therefore an object of the present invention to reduce the cost of solid-state power amplifiers which produce high power outputs.

It is another object of the present invention to provide a signal splitter/combiner which is broad-banded.

It is a further object of the present invention to provide a signal splitter/combiner which is compatible with modern solid-state amplifier designs.

It is still another object of the present invention to provide a signal splitter which provides equal output signal levels for maximum power amplifier efficiency.

It is still a further object of the present invention to provide a signal combiner having high power handling capability.

It is yet another object of the present invention to provide a signal splitter/combiner having zero or 180 degrees of phase shift.

It is yet a further object of the present invention to provide a signal splitter/combiner having low insertion losses.

It is still an additional object of the present invention to provide a signal combiner having a high degree of isolation between the input ports.

It is still an additional object of the present invention to provide a signal splitter/combiner having low input and output voltage standing wave ratios.

SUMMARY OF THE INVENTION

These and other objects of the invention are accomplished by providing a multiplicity of coaxial cable sections interconnected in a bridge configuration. Each cable section may be provided with a circumfusing ferrite sleeve to minimize the effects of the even mode impedances, and the impedance transforming characteristics of the combiner/splitter may be counteracted by interposing a coaxial transformer between the combiner/splitter and its input/output terminal.

BRIEF DESCRIPTION OF THE DRAWINGS

The invention may be more fully understood by reading the following description of a preferred embodiment thereof in conjunction with the appended drawings wherein.

DESCRIPTION OF A PREFERRED EMBODIMENT

Figure 1:
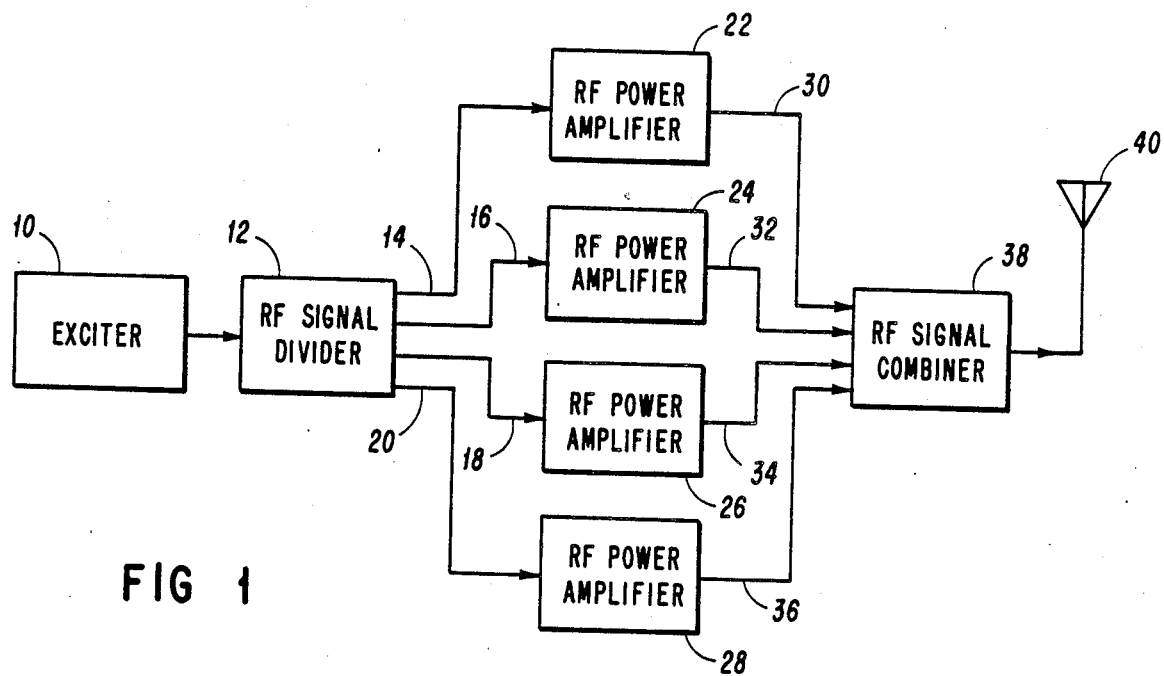
FIG. 1 is a block diagram of an RF system utilizing both a signal splitter and a signal combiner.

The present invention may be utilized in an RF transmitter system as shown in FIG. 1. The system uses an exciter 10, or other device, for producing a modulated RF signal for transmission to a distant location. Exciter 10 is coupled to an RF signal divider in accordance with the present invention, which divides the signal into four components at divider outputs 14, 16, 18 and 20. The signal components at outputs 14, 16, 18 and 20 are coupled respectively to RF power amplifiers 22, 24, 26, and 28, which amplify the signal components and provide the respective amplified signal components at outputs 30, 32, 34 and 36. These amplified signal components are coupled to an RF signal combiner 38 in accordance with the present invention. Signal combiner 38 and signal divider 12 are identical in design except that their input and output terminals are reversed and that in some cases combiner 38 may be modified to handle higher signal levels. The output of combiner 38 is coupled to an antenna, or other transmission device, 40, for transmission of the amplified signal to a distant location.

It should be understood that the depiction of a signal divider having four outputs and a signal combiner having four inputs is illustrative only, and other appropriate numbers of inputs or outputs may be utilized.

Figure 2:
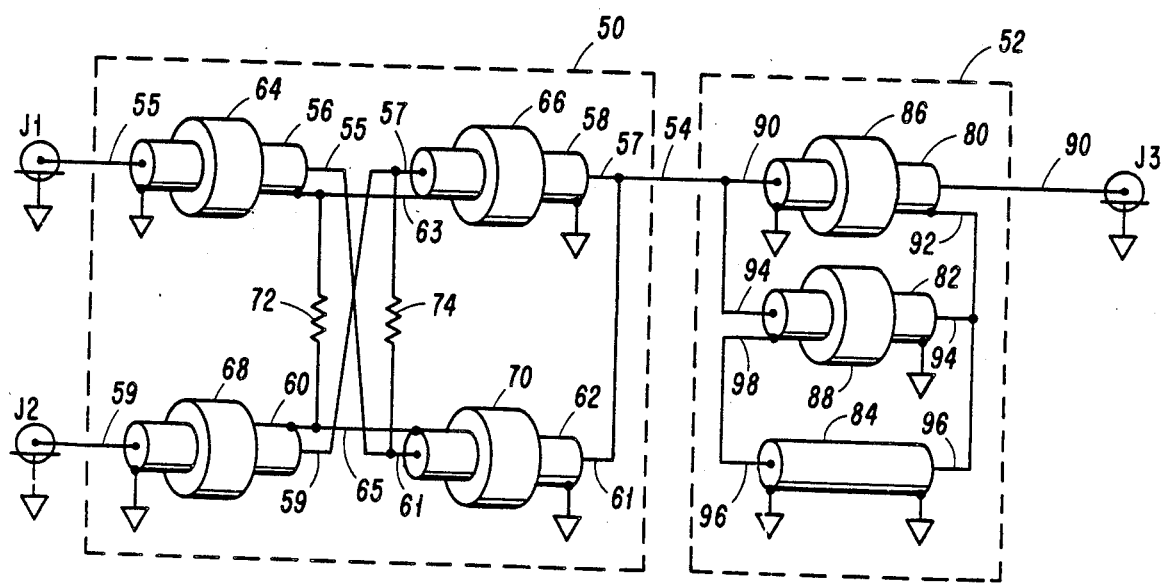
FIG. 2 is a somewhat schematic representation of a circuit embodying a 2-port version of the signal splitter/combiner of the present invention.

A two-port embodiment 50 of divider 12 or combiner 38 is shown in FIG. 2. Although the embodiment 50 may function either as a combiner or divider depending upon the manner of usage, for the sake of simplicity it will be referred to as a "combiner" with the understanding that both functions are included within that term. In addition, it should be understood that the terms "input" and "output" are interchangeable; and when one is referred to either in the specification or the appended claims, the other is also included. Combiner 50 also has associated therewith a transformer 52 in order to counteract the impedance reducing characteristics of combiner 50.

The overall combiner-transformer combiner 50/52 is provided with a pair of input terminals J1 and J2 and a single output terminal J3. The output of transformer 50 and the input of combiner 52 are interconnected by a conductor 54.

Combiner 50 comprises four sections of coaxial transmission line 56, 58, 60 and 62, each of which is preferably less than one-half wavelength at the frequency of interest to reduce even mode effects. Each of lines 56, 58, 60, and 62 may have a circumfusing toroidal ferrite sleeve 64, 66, 68, and 70, respectively, whose function is to minimize the effect of the even mode impedances between the transmission lines and the common ground plane. In other words, ferrites 64–70 prevent the flow of unbalanced current in the shielding of coaxial transmission lines 56–62.

The shielding of the transmission lines 56–62 is grounded to a common ground plane, as are terminals, or connectors, J1, J2 and J3, as indicated by the ground symbols. The signal conductor of terminal J1 is connected to the center conductor 55 of transmission line section 56, and the signal conductor of terminal J2 is similarly connected to the center conductor 59 of transmission line 60. Transmission lines 56–62 are interconnected in a bridge configuration as hereafter described. The center conductor 55 of transmission line section 56 is coupled to the center conductor 61 of transmission line section 62. Likewise, the center conductor 59 of line section 60 is coupled to the center conductor 57 of transmission line section 58. The shielding of transmission line section 56 is coupled to the shielding of transmission line section 58 by conductor line 63, and the shielding of section 60 is coupled to the shielding of section 62 by conductor line 65. Further, the shielding of sections 56 and 58 are coupled to the shielding of sections 60 and 62 through a dump resistor 72; and the center conductors of sections 56 and 62 are coupled to the center conductors of sections 58 and 60 through a dump resistor 74. In an alternate and more generalized form of the invention, dump resistors 72 and 74 could be replaced by sections of coaxial line similar to sections 56, 58, 60 and 62 (se FIG. 4). Finally, the center conductors 57 and 61 of sections 58 and 62, respectively, are both connected to line 54 which interconnects combiner 50 and transformer 52.

In the particular case shown, combiner 50 provides a 2:1 impedance reduction. In order to provide a standard 50 ohm input impedance, the characteristic impedances of section 56, 58, 60, and 62 should be 50 ohms, and the value of resistors 72 and 74 should also be 50 ohms. It should be understood, however, that other impedance and resistance values should be used if another input impedance is desired.

Transformer 52, which is shown in a 1:2 impedance transformation configuration includes three transmission line sections 80, 82 and 84. Sections 80 and 82 are provided with circumfusing toroidal ferrite sleeves 86 and 88, respectively, to minimize the effects of the previously-mentioned common mode impedances. The outer shielding of sections 80–84 are all grounded to the common ground plane as indicated by the ground symbols. The center conductor 90 of section 80 is connected on one end to interconnecting line 54 and to the signal conductor of terminal J3 on the other end. The shielding of section 80 is connected via line 92 to the center conductors 94 and 96 of sections 82 and 84, respectively. Center conductor 96 of section 84 is connected to the shielding of section 82 via line 98, and the center conductor 94 of section 82 is connected to the center conductor 90 of section 80 and line 54.

In the particular case shown, where a standard 50 ohm output impedance is desired, the characteristic impedance of transmission line sections 80, 82 and 84, should be 35 ohms. It should be realized however, that different characteristic impedances would be required if a different impedance were desired.

Figure 3:
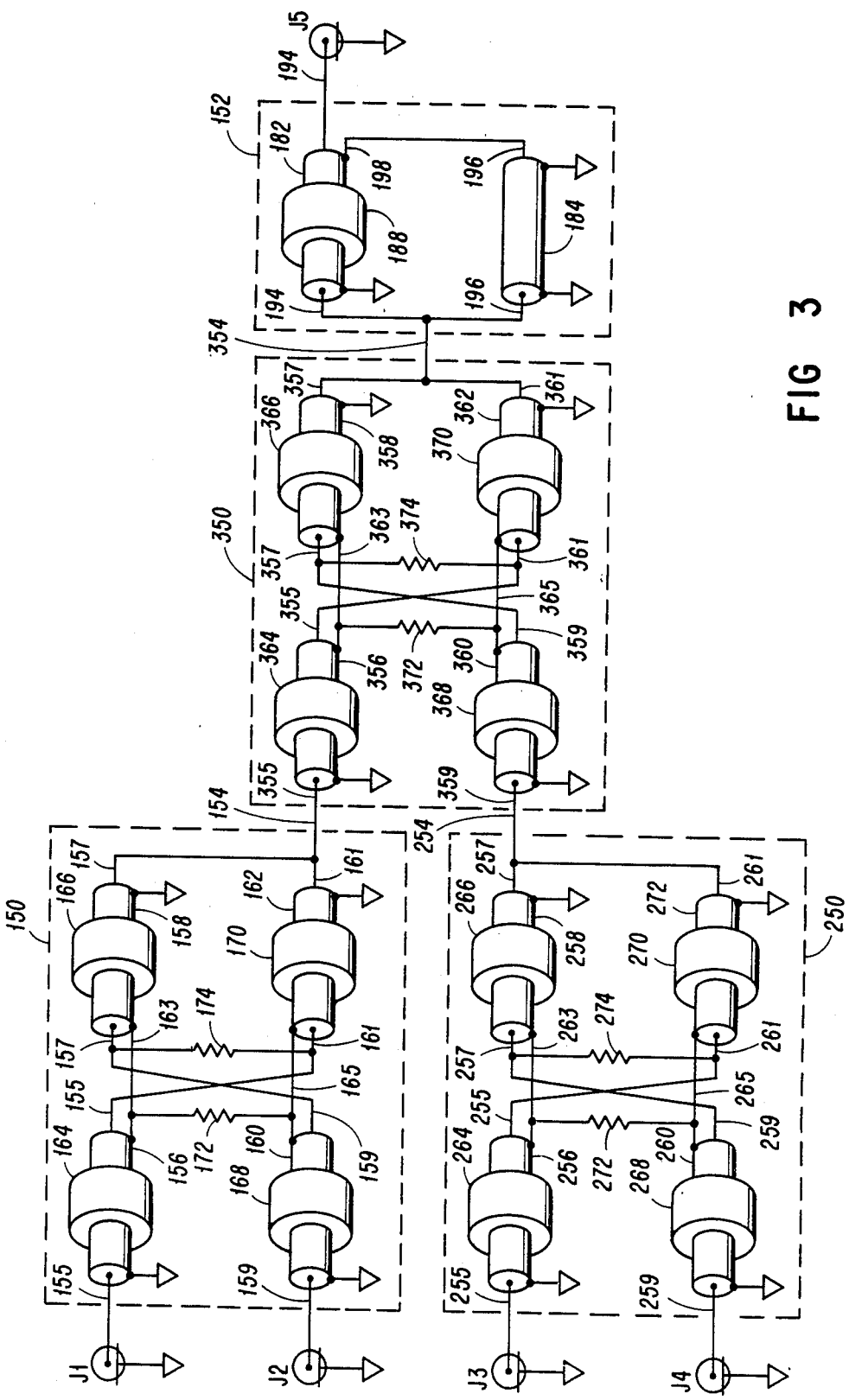
FIG. 3 is a somewhat schematic representation of a circuit embodying a 4-port version of the signal splitter/combiner of the present invention.

A four-port version of the combiner/divider of the present invention is shown in FIG. 3. As depicted, the device is comprised of two, two-port combiners 150 and 250 of the type shown in FIG. 2 cascaded with a third two-port combiner 350 and a 4:1 transformer 152. Combiner 150 is fed by connectors J1 and J2 while combiner 250 is fed by terminals J3 and J4. The output from transformer 152 is fed to terminal J5.

Combiners 150, 250, and 350 are identical in design to combiner 50 of FIG. 2, except that combiner 350 uses 25 ohm characteristic impedance transmission line and 25 ohm resistors 372 and 374. This is necessary to match the 25 ohm output impedance of combiners 150 and 250. Otherwise all components are identical to those in FIG. 2, and the similarity is reflected in the use of identical reference numbers in the tens and ones positions.

Since the 2:1 impedance step-down of combiner 350 results in a 12.5 ohm output impedance at the interconnection line 350, a 1:4 impedance step-up is required in transformer 152. This is achieved by the design shown which uses section 182 and 184 and which is identical to sections 182 and 184 in FIG. 3. The only difference is in the input and output connections of connector 182 in that center conductor 194 is connected to line 354 on the input side and to the signal conductor of terminal J5 on the output side.

Figure 4:
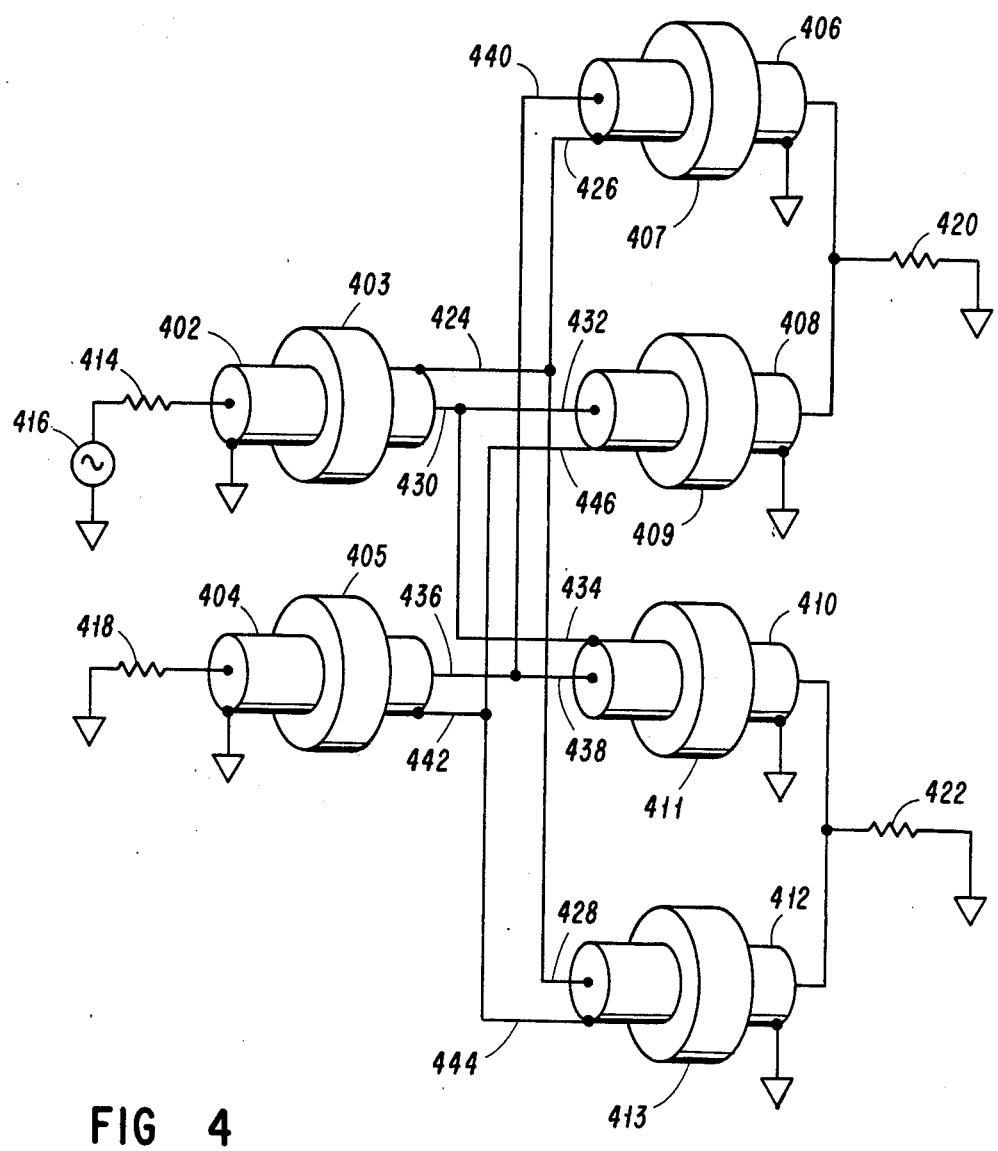
FIG. 4 is a somewhat schematic representation of a more generalized embodiment of the signal splitter/combiner of the present invention.

A more generalized embodiment of the RF signal splitter combiner of the present invention is shown in FIG. 4. The combiner comprises a pair of coaxial cable sections 402 and 404 on the "input" side of the circuit having circumfusing ferrite sleeves 403 and 405, respectively, and four coaxial cable sections 406, 408, 410, and 412 on the "output" side, each also having a circumfusing ferrite sleeve 407, 409, 411, and 413, respectively. The shield sections 402, 404, 406, 408, 410, and 412 are grounded as indicated by the standard ground symbol. The center conductor of section 402 is connected through a resistor 414, which represents the input source impedance, to signal source 416 which is also grounded on one side. The center conductor of section 404 is connected to dump resistor 418 which is also connected to ground on its other side. The center conductors of each of cable sections 406 and 408 are commonly connected to grounded output resistor 420, which represents the load impedance of the device to which the splitter/combiner is connected. Likewise, the center conductors of sections 410 and 412 are commonly connected to grounded output resistor 422 which represents the load impedance of the device which the splitter/combiner is connected.

Sections 402, 404, 406, 408, 410 and 412 are interconnected in a bridge configuration. The shield conductor 424 of section 402 is connected both to the shield conductor 426 of section 406 and the center conductor 428 of section 412. The center conductor 430 of section 402 is connected both to the center conductor 432 of section 408 and the shield conductor 434 of section 410. The center conductor 436 of section 404 is connected both to the center conductor 438 of section 410 and to the center conductor 440 of section 406. Finally, shield conductor 442 of section 404 is connected both to the shield conductor 444 of section 412 and the shield conductor 446 of section 408.

As illustrated, the circuit of FIG. 4 functions as a signal splitter. As previously stated, the circuit may function as a signal combiner by reversing the input and output connections. Also as illustrated the splitter provides a 180 degree phase shift. If a zero degree phase shift is desired, signal source 416 should be connected between resistor 418 and ground. Likewise, in the combiner application the phase shift of either 180° or 0° can be selected by connecting the output to either section 402 or section 404, respectively.

Impedance transformations in the combiner/splitter of FIG. 4 can be counteracted using coaxial cable transformers as previously described in connection with FIGS. 2 and 3.

In the operation of the signal combiner version of the present invention, the signals to be combined are inputted into terminals J1 and J2 and are thence conducted through transmission line sections 56 and 60, respectively, and are combined by the bridge interconnections of like sections 56, 58, 60, and 62. The combined signal is coupled via line 54 to impedance transformer 52 which provides the combined signal to terminal J3 at the original input impedance of input terminals J1 and J2. In the case of a signal splitter, the foregoing operation is reversed. The alternative embodiment of FIG. 4 operates in a similar fashion.

The four-port version of the signal combiner, which is comprised of three two-port combiners, operates in a similar fashion. Combiner 150 combines signals at terminals J1 and J2 and provides them on one input line 154 of combiner 350. Similarly, combiner 250 combines signals at terminals J3 and J4 and provides them to the second input line 254 of combiner 350. The combined signals at lines 154 and 254 are further combined and outputted on line 354. Since the signal passes through two 2:1 transformer stages for an effective 4:1 impedance transformation, transformer 152 provides a 1:4 transformation to provide the signal at output terminal J5 at the same input impedances as at terminals J1, J2, J3, and J4. Again, in the splitter version of the invention, the foregoing operation is simply reversed.

The use of the bridge configuration in conjunction with the coaxial transmission line of the type specified in the signal splitter/combiner of the present invention provides several important advances in performance:

1. The frequency range is from 20 MHz to 500 MHz, which is greater than eight octaves;
2. The insertion loss is less than 0.4 dB;
3. The isolation between input ports is greater than 20 dB;
4. The input and output voltage standard wave ratio is less than 1.2:1;
5. The average output power exceeds 500 watts; and
6. Either zero or 180 degrees of phase shift may be selected.

While particular embodiments of the invention have been shown and described, it is obvious that minor changes and modifications may be made therein without departing from the true scope and spirit of the invention. It is the intention of the appended claims to cover all such changes and modifications.

We claim:

1. An RF signal splitter/combiner, utilizing coaxial cable having a center signal conductor and a shield conductor, comprising:
   first input means;
   second input means;
   output means;
   a first coaxial cable section having its first end coupled to the first input means;
   a second coaxial cable section having its first end coupled to the second input means;
   a third coaxial cable section having its first end coupled to the output means;
   a fourth coaxial cable section having its first end coupled to said output means;
   a first resistor coupled between the shield conductors of the first and second cable sections; and
   a second resistor coupled between the center signal conductors of the third and fourth cable sections;
   said first cable section further having its shield conductor coupled to the shield conductor of said third cable section and its center conductor coupled to the center conductor of said fourth cable section; and
   said second cable section further having its shield conductor coupled to the shield conductor of said fourth cable section and its center conductor coupled to the center conductor of said third cable section.

2. The RF signal splitter/combiner as described in claim 1 wherein said output means comprises an impedance transformer.

3. The RF signal splitter/combiner as described in claim 2 further including a ferrite sleeve circumfusing each of said coaxial cable sections.

4. The RF signal splitter/combiner as described in claim 1 wherein said impedance transformer comprises a plurality of coaxial cable sections.

* * * * *